United States Patent [19]

Chao

[11] Patent Number: 6,066,986

[45] Date of Patent: *May 23, 2000

[54] INTEGRATED MONOLITHIC OPERATIONAL AMPLIFIER WITH ELECTRICALLY ADJUSTABLE INPUT OFFSET VOLTAGE

[76] Inventor: Robert L. Chao, 14555 Harvard Ct., Los Altos, Calif. 94022

[*] Notice: This patent issued on a continued prosecution application filed under 37 CFR 1.53(d), and is subject to the twenty year patent term provisions of 35 U.S.C. 154(a)(2).

[21] Appl. No.: 09/069,592

[22] Filed: Apr. 29, 1998

[51] Int. Cl.[7] ................................................... H03F 3/45
[52] U.S. Cl. ............................................... 330/261; 330/9
[58] Field of Search .......................................... 330/9, 261

[56] References Cited

U.S. PATENT DOCUMENTS

| 4,393,351 | 7/1983 | Gregorian et al. | 328/127 |
|---|---|---|---|
| 4,580,103 | 4/1986 | Tompsett | 330/9 |
| 4,841,252 | 6/1989 | Lou | 330/9 |
| 4,987,327 | 1/1991 | Fernandez et al. | 307/491 |

*Primary Examiner*—Robert Pascal
*Assistant Examiner*—Henry Choe
*Attorney, Agent, or Firm*—Harry M. Weiss; Jeffrey Weiss; Paul W. Davis

[57] ABSTRACT

An integrated operational amplifier device has an operational amplifier device, and means connected to the operational amplifier device for providing at least one of a positive and a negative electrically adjustable input offset voltages. The system further comprises semiconductor device means for affecting the amount of input offset voltage supplied to the operational amplifier device. The system further comprises charge storage device means for storing a charge for maintaining a constant input offset voltage for controlling the operation of the semiconductor device means. The charge storage device means, the semiconductor device means, and the operational amplifier device are a monolithic integrated circuit.

16 Claims, 1 Drawing Sheet

INTEGRATED MONOLITHIC OPERATIONAL AMPLIFIER WITH ELECTRICALLY ADJUSTABLE INPUT OFFSET VOLTAGE

RELATED APPLICATION

This patent application is related to issued U.S. Pat. No. 5,309,009 entitled "Integrated Electrically Adjustable Analog Transistor Device," in the name of the same inventor, and is incorporated herein by reference.

BACKGROUND OF THE INVENTION

1. Field of the Invention

This invention is in the field of integrated operational amplifier devices and methods therefor and, more particularly, is a system for providing a low cost electrically adjustable input offset voltage ($v_{os}$) circuit coupled to an operational amplifier device in a monolithic integrated circuit package.

2. Description of the Related Art

One of the most important characteristics of an operational amplifier device is its input offset voltage. In an ideal operational amplifier, when both input terminals are grounded, the ideal operational amplifier will develop zero output voltage. However, a practical, or real operational amplifier will have some finite amount of voltage at its output when the inputs are grounded. This finite output voltage exists because of the many sources of voltage error inherent within a real operational amplifier device, and collectively the resultant voltage errors are referred to as the equivalent input offset voltage. In order to correct this finite output voltage to a zero amount, or as close as possible, two primary solutions are possible; Either external circuitry must be used to supply an input offset voltage, a solution that adds complexity and circuitry external to the integrated circuit operational amplifier, or the physical structure of the integrated circuit must be adjusted using a laser modification procedure.

The preferred solution to minimize the equivalent input offset voltage has been to trim or adjust the operational amplifier device at the factory to minimize or eliminate the external circuitry required. This trimming of the operational amplifier device is performed at the factory using specially developed equipment to employ a laser modification procedure. This procedure has significant drawbacks economically due to the cost of the laser equipment, and the inability to undo a laser adjustment after the fact.

The present invention allows the processing of bulk numbers of operational amplifiers using extremely inexpensive equipment rather than the very expensive laser method. Additionally, the present invention allows for the re-adjustment of the $v_{os}$ circuit, something that is not possible with the present laser $v_{os}$ adjustment method. Additionally, the $v_{os}$ adjustment may be used to actually set the operational amplifier device to have an output voltage that is zero, positive, or negative for different operating conditions including when the operational amplifier device has both of its inputs grounded. Finally, the present invention will provide for the adjusted input offset voltage value to be retained practically indefinitely by means of a charge storage device embedded within the monolithic structure of the integrated operational amplifier device.

(It should be noted that the terms "equivalent offset voltage" and "input offset voltage" though possessing very slight differences in meaning are generally used interchangeably by those skilled in the art, and the explicit meaning may be contextual based on the usage. Therefor, the use of either "equivalent offset voltage" or "input offset voltage" herein is not meant to be limiting and those well skilled in the art will recognize the interchangeable usage of the terms.)

SUMMARY OF THE INVENTION

An object of the present invention is to provide an integrated monolithic operational amplifier device that allows the equivalent offset voltage of the operational amplifier device to be adjusted using an imbedded $v_{os}$ circuit that allows a computerized, very efficient adjustment of the input offset voltage.

Another object of the present invention is to provide an integrated monolithic operational amplifier device that allows the processing of bulk numbers of operational amplifiers using extremely inexpensive equipment rather than the very expensive laser method currently being used in order to achieve significant cost savings.

Still another object of the present invention is to provide an integrated monolithic operational amplifier device that allows for repeated adjustments of the $v_{os}$ circuit.

Still another object of the present invention is to provide an integrated monolithic operational amplifier device in which the $v_{os}$ adjustment may actually set the operational amplifier device to an output voltage that is zero, positive, or negative when the operational amplifier device has both of its inputs grounded.

It is yet another object of the present invention to provide a device where the adjusted input offset voltage value is retained indefinitely by means of a charge storage device wherein the charge storage device is embedded within the monolithic structure of the operational amplifier device, and where the charge stored in the storage device is capable of holding the charge for a practically indefinite period of time.

The fabrication of this invention can be implemented using conventional CMOS fabrication materials and methods.

BRIEF DESCRIPTION OF THE PREFERRED EMBODIMENTS

In accordance with one embodiment of the present invention, an integrated operational amplifier device is disclosed. The integrated operational amplifier device uses an operational amplifier device. Means are connected to the operational amplifier device for providing at least one of a positive and/or a negative electrically adjustable input offset voltage. The integrated operational amplifier device further comprises semiconductor device means coupled to said operational amplifier device for affecting the amount of input offset voltage supplied to the operational amplifier device, and charge storage device means coupled to said semiconductor device means for storing a charge for maintaining a constant input offset voltage for controlling the operation of the semiconductor device means. The charge storage device means, the semiconductor device means, and the operational amplifier device are a monolithic integrated circuit.

In accordance with another embodiment of the present invention, an integrated operational amplifier device is disclosed comprising, in combination, an operational amplifier device, and means connected to the operational amplifier device for providing a positive and a negative electrically adjustable input offset voltage. The integrated operational amplifier device further comprises semiconductor device means coupled to said operational amplifier device for affecting the amount of input offset voltage supplied to the operational amplifier device, and charge storage device means coupled to said semiconductor device means for storing a charge for maintaining a constant input offset voltage for controlling the operation of the semiconductor device means. The charge storage device means, the semiconductor device means, and the operational amplifier device are a monolithic integrated circuit.

In accordance with another embodiment of the present invention, an integrated operational amplifier device is disclosed comprising, in combination, an operational amplifier device, and means connected to the operational amplifier device for providing a positive electrically adjustable input offset voltage. The integrated operational amplifier device further comprises semiconductor device means coupled to said operational amplifier device for affecting the amount of input offset voltage supplied to the operational amplifier device, and charge storage device means coupled to said semiconductor device means for storing a charge for maintaining a constant input offset voltage for controlling the operation of the semiconductor device means. The charge storage device means, the semiconductor device means, and the operational amplifier device are a monolithic integrated circuit.

In accordance with another embodiment of the present invention, an integrated operational amplifier device is disclosed comprising, in combination, an operational amplifier device, and means connected to the operational amplifier device for providing a negative electrically adjustable input offset voltage. The integrated operational amplifier device further comprises semiconductor device means coupled to said operational amplifier device for affecting the amount of input offset voltage supplied to the operational amplifier device, and charge storage device means coupled to said semiconductor device means for storing a charge for maintaining a constant input offset voltage for controlling the operation of the semiconductor device means. The charge storage device means, the semiconductor device means, and the operational amplifier device are a monolithic integrated circuit.

The foregoing and other objects, features, and advantages of the invention will be apparent from the following, more particular, description of the preferred embodiments of the invention, as illustrated in the accompanying drawings.

DESCRIPTION OF THE PREFERRED EMBODIMENTS

Figure 1:
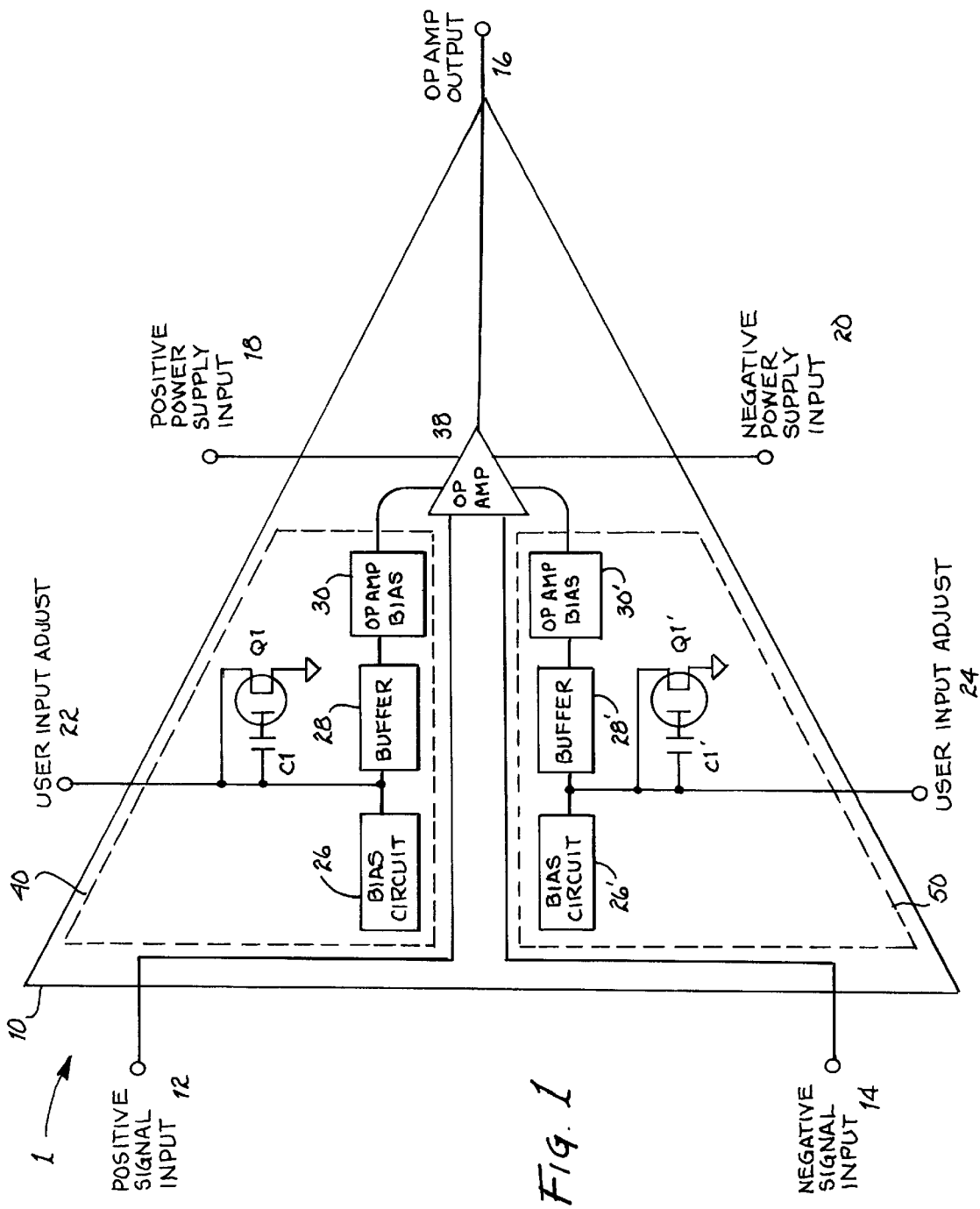
FIG. 1. is a functional block diagram of a monolithic, integrated operational amplifier device featuring embedded $v_{os}$ adjustment circuitry.

Referring to FIG. 1 a functional block diagram of a monolithic, integrated operational amplifier device featuring embedded $v_{os}$ adjustment circuitry is shown. (Hereinafter the "system" 1) The system 1 uses an integrated, monolithic operational amplifier (hereinafter the "integrated Op Amp 10"). The integrated Op Amp 10 has at its core as the central component, an operational amplifier 38. In a preferred embodiment the operational amplifier 38 is an integrated metal oxide semiconductor (MOS) and is well known in the art. However, those skilled in the art will recognize that other semiconductor materials could also be used in the fabrication of an operational amplifier and the use of MOS technology is not meant to be limiting.

The operational amplifier 38 has coupled to it standard operational amplifier inputs and outputs consisting of:

| Positive Power Supply Input 18 | Negative Power Supply Input 20 |
|---|---|
| Positive Signal Input 12 | Negative Signal Input 14 |
| Op Amp output 16. | |

Also coupled to the operational amplifier 38 are two input voltage offset control circuits 40 and 50. The contents of the two input voltage offset control circuits 40 and 50 are functionally identical in the embodiments discussed herein and the same reference numbers will be used for both circuits with the exception that input voltage offset control circuit 50 will have a prime numbering scheme. (i.e. 26 becomes 26', 28 becomes 28' etc.)

It should also be noted that the description herein addresses each input offset voltage circuit 40 and 50 on an individual basis as though each circuit was solely operational or responsible for the overall functioning of the system 1. Though it is possible for this to be true, those well skilled in the art will recognize that either input offset voltage circuit 40 or 50, or a combination thereof could be actually controlling the system 1 and the description below is still technically accurate. Additionally, even though the described embodiments use a positive and a negative input offset voltage circuit, the present invention could be manufactured using many different combinations of input offset voltage circuits. For example, the input offset voltage circuits could consist of: two positive input offset voltage circuits, two negative input offset voltage circuits, or a plurality of many positive and/or negative input offset voltage circuits in combination, all without departing from the idea of the present invention. Furthermore, even though the embodiments discussed herein portray the input offset voltage circuit 40 and 50 as identical, those well skilled in the art will recognize that different circuits could be used to produce the same result or functions as described herein and the circuits herein though described the same are not required to be identical, nor are they limited to being identical.

The input voltage offset control circuit 40 and 50 are coupled to the operational amplifier 38 and supply the input offset voltage ($v_{os}$) signals to the operational amplifier 38. The two circuits herein are functionally identical but the operational amplifier 38 uses input voltage offset control circuit 40 for a input offset voltage ($v_{os}$) signal of one polarity, and uses input voltage offset control circuit 50 for an opposite polarity input offset voltage ($v_{os}$) signal.

The input voltage offset control circuit 40 comprises a bias circuit 26 coupled to the buffer 28, which is in turn coupled to the Op Amp bias circuit 30. Coupled to the bias circuit 26 and the buffer 28 is the User Input Adjust 22. The User Input Adjust 22 will be coupled to a programming source (not shown herein) supplied by the user or the manufacturer. The desired charge will be inputted for storage in the storage device C1. The storage device C1 is coupled to, and is used in conjunction with, the semiconductor device Q1 and the bias circuit 26 to supply a desired $v_{os}$ adjustment signal voltage to the buffer 28.

The input voltage offset control circuit 50 comprises a bias circuit 26' coupled to the buffer 28', which is in turn coupled to the Op Amp bias circuit 30'. Coupled to the bias circuit 26' and the buffer 28' is the User Input Adjust 24. The User Input Adjust 24 will be coupled to a programming source (not shown herein) supplied by the user or the manufacturer. The desired charge will be inputted for storage in the storage device C1'. The storage device C1' is coupled to, and is used in conjunction with, the semiconductor device Q1' and the bias circuit 26' to supply a desired $\upsilon_{os}$ adjustment signal voltage to the buffer 28'.

OPERATION

The central idea of the present invention is discussed herein. As is well known in the art, operational amplifiers inherently have some finite voltage at the op amp output 16 even when both the inputs 12 and 14 are grounded. As also previously discussed, the two primary methods of correction for this have, until now, either been external circuitry to inject an input offset voltage ($\upsilon_{os}$), and/or a physical structure adjustment of the operational amplifier device using a laser. In the present invention however, external circuits are not required, nor is the expensive laser procedure required.

Coupled to the operational amplifier 38 are two input voltage offset control circuits 40 and 50. The voltage offset control circuits 40 and 50 are coupled by the user to a programming device or system. A computer system is very well suited to this application. The two input voltage offset ($\upsilon_{os}$) circuits are functionally identical but the operational amplifier 38 uses input voltage offset control circuit 40 for a input offset voltage ($\upsilon_{os}$) signal of one polarity, and uses input voltage offset control circuit 50 for an opposite polarity input offset voltage ($\upsilon_{os}$) signal. The use of two input offset voltage ($\upsilon_{os}$) signals enables the possibility of zero, positive, or negative voltages at the Op Amp output 16.

Referring to the input voltage offset control circuit 40, the input offset voltage ($\upsilon_{os}$) values, which are supplied to an external programming device via the Op Amp output 16, cause the programming device to send the correct programming signals via the user input adjust 22 input. The input offset voltage ($\upsilon_{os}$) programming signals input via the user input adjust 22 cause the desired charge to be loaded and stored in the charge storage device C1. The value of this charge placed in the charge storage device C1 will determine the amount of gating of the semiconductor device Q1. The amount of the gating of the semiconductor device Q1 will determine a resulting current which corresponds to a current supplied from the bias circuit 26.

The current from the bias circuit 26 and semiconductor device Q1 will result in a voltage input to the buffer 28. The buffer 28 will process this voltage and produce an output signal consisting of a voltage, or a current, or both. The output signal from the buffer 28 is inputted to the Op Amp bias circuit 30. The Op Amp bias circuit 30 produces a voltage needed to cause the operational amplifier 38 to have the required $\upsilon_{os}$ to produce the desired or correct value at the Op Amp output 16.

(It should be noted that the operational amplifier 38 has its own internal bias circuitry as do many types of operational amplifier devices and this should not be confused with the Op Amp bias Circuit 30 or 30'.)

Referring to the input voltage offset control circuit 50, the input offset voltage ($\upsilon_{os}$) values, which are supplied to an external programming device via the Op Amp output 16, cause the programming device to send the correct programming signals via the user input adjust 24 input. The input offset voltage ($\upsilon_{os}$) programming signals input via the user input adjust 24 cause the desired charge to be loaded and stored in the charge storage device C1'. The value of this charge placed in the charge storage device C1' will determine the amount of gating of the semiconductor device Q1'. The amount of the gating of the semiconductor device Q1' will determine a resulting current which corresponds to a current supplied from the bias circuit 26'.

The current from the bias circuit 26' and semiconductor device Q1' will result in a voltage input to the buffer 28'. The buffer 28' will process this voltage and produce an output signal consisting of a voltage, or a current, or both. The output signal from the buffer 28' is inputted to the Op Amp bias circuit 30'. The Op Amp bias circuit 30' produces a voltage needed to cause the operational amplifier 38 to have the required $\upsilon_{os}$ to produce the desired or correct value at the Op Amp output 16.

Nominally, the Op Amp output 16 is desired to have a zero value when both positive signal input 12 and negative signal input 14 are grounded. With the present invention however, it is possible to have zero, or a positive, or a negative value at the Op Amp output 16.

As shown with the present invention it is possible to have a monolithic integrated operational amplifier circuit that can be trimmed without the expense of the laser equipment. Moreover, the integrated op amp 10 can be reprogrammed as many times as desired, and the charge storage device will hold the desired charge for what is essentially an infinite time period without the integrated op amp 10 being supplied with power.

As a final note, it is pointed out that for applications involving multiple operational amplifiers on a single chip, a multiplexing scheme could be utilized to enable the programming of these multiple operational amplifiers.

Although the invention has been particularly shown and described with reference to a preferred embodiment thereof, it will be understood by those skilled in the art that changes in form and detail may be made therein without departing from the spirit and scope of the invention.

What is claimed is:

1. An integrated operational amplifier device, comprising, in combination:

an operational amplifier device;

means connected to said operational amplifier device for providing at least one of a positive and a negative electrically adjustable input offset voltage devoid of ac;

a programmed charge storage device means coupled to said operational amplifier device for storing a substantially constant programmed dc charge;

semiconductor device means connected to said charge storage device means output for affecting the amount of input offset voltage supplied to said operational amplifier device in direct proportion to said substantially constant programmed dc charge;

a user input adjust means connected to said programmed charge storage device means input for accepting a programming signal comprised of said substantially constant programmed dc charge; and wherein said programmed charge storage device means output is connected to said semiconductor device means input for supplying said substantially constant programmed dc charge stored in said programmed charge storage device means to said semiconductor device means input.

2. The system of claim 1 wherein said semiconductor device means is a metal oxide semiconductor device.

3. The system of claim 2 wherein said charge storage device means is a semiconductor capacitor.

4. The system of claim 3 wherein said charge storage device means, said semiconductor device means, and said operational amplifier device are a monolithic integrated circuit.

5. An integrated operational amplifier device, comprising, in combination:

an operational amplifier device;

means connected to said operational amplifier device for providing a positive and a negative electrically adjustable input offset voltage devoid of ac;

a programmed charge storage device means coupled to said operational amplifier device for storing a substantially constant programmed dc charge;

semiconductor device means connected to said charge storage device means output for affecting the amount of input offset voltage supplied to said operational amplifier device in direct proportion to said substantially constant programmed dc charge;

a user input adjust means connected to said programmed charge storage device means input for accepting a programming signal comprised of said substantially constant programmed dc charge; and wherein said programmed charge storage device means output is connected to said semiconductor device means input for supplying said substantially constant programmed dc charge stored in said programmed charge storage device means to said semiconductor device means input.

6. The system of claim 5 wherein said semiconductor device means is a metal oxide semiconductor device.

7. The system of claim 6 wherein said charge storage device means is a semiconductor capacitor.

8. The system of claim 7 wherein said charge storage device means, said semiconductor device means, and said operational amplifier device are a monolithic integrated circuit.

9. An integrated operational amplifier device, comprising, in combination:

an operational amplifier device;

means connected to said operational amplifier device for providing a positive electrically adjustable input offset voltage devoid of ac;

a programmed charge storage device means coupled to said operational amplifier device for storing a substantially constant programmed dc charge;

semiconductor device means connected to said charge storage device means output for affecting the amount of input offset voltage supplied to said operational amplifier device in direct proportion to said substantially constant programmed dc charge;

a user input adjust means connected to said programmed charge storage device means input for accepting a programming signal comprised of said substantially constant programmed dc charge; and wherein said programmed charge storage device means output is connected to said semiconductor device means input for supplying said substantially constant programmed dc charge stored in said programmed charge storage device means to said semiconductor device means input.

10. The system of claim 9 wherein said semiconductor device means is a metal oxide semiconductor device.

11. The system of claim 10 wherein said charge storage device means is a semiconductor capacitor.

12. The system of claim 11 wherein said charge storage device means, said semiconductor device means, and said operational amplifier device are a monolithic integrated circuit.

13. An integrated operational amplifier device, comprising, in combination:

an operational amplifier device;

means connected to said operational amplifier device for providing a negative electrically adjustable input offset voltage devoid of ac;

a programmed charge storage device means coupled to said operational amplifier device for storing a substantially constant programmed dc charge;

semiconductor device means connected to said charge storage device means output for affecting the amount of input offset voltage supplied to said operational amplifier device in direct proportion to said substantially constant programmed dc charge;

a user input adjust means connected to said programmed charge storage device means input for accepting a programming signal comprised of said substantially constant programmed dc charge; and wherein said programmed charge storage device means output is connected to said semiconductor device means input for supplying said substantially constant programmed dc charge stored in said programmed charge storage device means to said semiconductor device means input.

14. The system of claim 13 wherein said semiconductor device means is a metal oxide semiconductor device.

15. The system of claim 14 wherein said charge storage device means is a semiconductor capacitor.

16. The system of claim 15 wherein said charge storage device means, said semiconductor device means, and said operational amplifier device are a monolithic integrated circuit.

* * * * *